(12) United States Patent
Yamamoto

(10) Patent No.: US 7,694,255 B2
(45) Date of Patent: Apr. 6, 2010

(54) VARIABLE DELAY CIRCUIT, RECORDING MEDIUM, LOGIC VERIFICATION METHOD AND ELECTRONIC DEVICE

(75) Inventor: Kazuhiro Yamamoto, Tokyo (JP)

(73) Assignee: Advantest Corporation, Tokyo (JP)

( * ) Notice: Subject to any disclaimer, the term of this patent is extended or adjusted under 35 U.S.C. 154(b) by 296 days.

(21) Appl. No.: 11/708,666

(22) Filed: Feb. 20, 2007

(65) Prior Publication Data
US 2007/0226670 A1    Sep. 27, 2007

Related U.S. Application Data

(63) Continuation of application No. PCT/JP2005/015558, filed on Aug. 26, 2005.

(30) Foreign Application Priority Data

Aug. 30, 2004    (JP) .............................. 2004-250058

(51) Int. Cl.
G06F 17/50    (2006.01)
(52) U.S. Cl. ............................................. 716/6; 716/5
(58) Field of Classification Search .................. 716/5–6
See application file for complete search history.

(56) References Cited

U.S. PATENT DOCUMENTS 6,215,345 B1    4/2001    Yashiba et al.
6,598,187 B1    7/2003    Koto et al.
7,158,443 B2 *    1/2007    Lin ........................ 365/189.07
7,296,246 B1 *    11/2007    Kuehlmann et al. ............ 716/2
2005/0110548 A1 *    5/2005    Suda et al. .................. 327/277

FOREIGN PATENT DOCUMENTS

JP    63-177437    7/1988
JP    10-283388    10/1998

OTHER PUBLICATIONS

International Search Report issued in International Application No. PCT/JP2005/015558 mailed on Oct. 25, 2005 and English translation thereof, 3 pages.

* cited by examiner

*Primary Examiner*—Vuthe Siek
(74) *Attorney, Agent, or Firm*—Osha • Liang LLP

(57)    ABSTRACT

There is provided a variable delay circuit to be implemented in an integrated circuit, the variable delay circuit including: a variable delay assigning section that assigns a variable time delay to an input signal in an actual operation of the integrated circuit, the variable time delay being varied within a predetermined range in accordance with a time delay inherent in an implementation level; and a verification delay assigning section that assigns a predetermined fixed time delay to the input signal in low-speed logic verification and/or in a low-speed selection test of the integrated circuit. For example, the time delay assigned by the verification delay assigning section is larger than a maximum value of the time delay assigned by the variable delay assigning section.

7 Claims, 9 Drawing Sheets

VARIABLE DELAY CIRCUIT, RECORDING MEDIUM, LOGIC VERIFICATION METHOD AND ELECTRONIC DEVICE

CROSS REFERENCE TO RELATED APPLICATION

This is a continuation application of PCT/JP2005/015558 filed on Aug. 26, 2005, which claims priority from a Japanese Patent Application No. 2004-250058 filed on Aug. 30, 2004, the contents of which are incorporated herein by reference.

BACKGROUND

1. Technical Field

The present invention relates to a variable delay circuit to be implemented to an integrated circuit, a recording medium storing therein a program that operates a computer as a logic verification apparatus that conducts logic verification directed to an integrated circuit to which a variable delay circuit is implemented, a logic verification method for device data with use of the variable delay circuit, and an electronic device using the variable delay circuit.

2. Related Art

Recently, computer-aided designing (CAD) has been adopted in an integrated circuit constituted by numerous circuit devices such as transistors, since it is difficult to design all the concrete circuit structures of such an integrated circuit manually. The development stage that uses the CAD is performed as follows; using so-called hardware description language based on the decided specification, abstract circuit data is defined in accordance with a function of an integrated circuit to be developed; a logic circuit is generated by performing logic synthesis or the like based on the defined circuit data; and the concrete circuit structure is thereafter defined to be implemented onto a chip (e.g. see the Japanese Patent Application Publication No. H10-283388.)

In an integrated circuit manufactured by undergoing such a design stage, verification operations both in logic level and in actual operation level are generally performed during the manufacturing stage. For example, logic verification is conducted using a low-speed inspection apparatus in the wafer level stage thereby expelling defective items, and the actual operation verification is performed in the stage after the packaging of chips is completed, so that only products judged as non-defective are shipped.

In the stage of actually forming designed circuits onto a semiconductor substrate, it is not easy to fully reproduce the electric characteristics of the designed circuit structure, due to process variations and the like. There are cases where the characteristic is different between the designed circuit and the implemented circuit. It will cause no problem in practical sense if such a characteristic difference is minor. However, in such sections as operating in high speed, there are cases where the operations are adversely affected due to a difference in time delay caused by wiring length variations and the like.

So as to counter this problem, there have been already proposed integrated circuits incorporating therein a variable delay circuit for assigning a variable time delay for absorbing fluctuation in time delay attributable to process variations and the like and for realizing characteristics as designed. By adjusting the time delay with use of such a variable delay circuit, it becomes possible to absorb time delay fluctuation attributable to process variations and the like, and further to improve yield of the integrated circuits.

However, an integrated circuit incorporating therein a conventional variable delay circuit has a problem that logic verification by means of a low-speed inspection apparatus is difficult. This problem is detailed as follows.

FIG. 9 is a schematic diagram showing one example of a circuit structure that uses a conventional variable delay circuit The circuit illustrated in FIG. 9 is composed of a variable delay circuit 101, a flip-flop circuits 102 and 103, and delay circuits 104 and 105. The following problem arises when low-speed verification is performed on such a circuit using a low-speed inspection apparatus.

Conventional variable delay circuits cannot define the time delay at a certain value even in the low-speed verification because the time delay amount to be assigned is variable. Accordingly, when for example such a variable delay circuit is adopted in the circuit structure as shown in FIG. 9, it is not certain whether it is possible to provide a sufficient hold time for holding the data to be inputted to the flip-flop circuit 102 that is positioned in the later stage. Accordingly, when a circuit structure as shown in FIG. 9 is realized using a conventional variable delay circuit, sometimes low-speed verification may find it a defective item even if the flip-flop circuit 102 itself does not have any problem and can operate without trouble if using a variable delay circuit after adjustment of the time delay, which means deterioration in verification accuracy.

This also applies to logic verification in the designing stage. It is difficult to adopt integrated circuits incorporating therein conventional variable delay circuits to a normal logic design environment, and the number of processes required for analogue verification greatly increases.

SUMMARY

In view of the above, an aspect of the present invention is to realize a variable delay circuit, a recording medium, a logic verification method, a test method, and an electronic device, which are able to be adopted to low-speed verification of an integrated circuit formed on a substrate, and to a logic design environment during a designing stage of an integrated circuit. This advantage is achieved by a combination of features disclosed in the independent claims of the appended claims. Moreover, the dependent claims define further advantageous examples of the present invention.

So as to solve the foregoing problems, according to the first aspect of the present invention, there is provided a variable delay circuit to be implemented in an integrated circuit, the variable delay circuit including: a variable delay assigning section that assigns a variable time delay to an input signal in an actual operation of the integrated circuit, the variable time delay being varied within a predetermined range in accordance with a time delay inherent in an implementation level; and a verification delay assigning section that assigns a predetermined fixed time delay to the input signal in low-speed logic verification and/or in a low-speed selection test of the integrated circuit.

The time delay assigned by the verification delay assigning section may be either larger than a maximum value of the time delay assigned by the variable delay assigning section or smaller than a minimum value of the time delay assigned by the variable delay assigning section.

The variable delay circuit may further include: a selector that selects the variable delay assigning section in the actual operation, and selects the verification delay assigning section in the low-speed logic verification and/or the low-speed selection test.

The variable delay circuit may flintier include: an output signal detection section that detects presence or absence of a signal outputted via the variable delay assigning section and the verification delay assigning section.

According to the second aspect of the present invention, there is provided a recording medium storing therein a program for causing a computer to conduct logic verification directed to an integrated circuit to which a delay circuit is implemented, the program including: a variable delay assigning circuit data code that causes a variable delay assigning circuit to be incorporated into the integrated circuit, the variable delay assigning circuit being for assigning a variable time delay to an input signal by being selected as the delay circuit in an actual operation of the integrated circuit, the variable time delay being varied within a predetermined range in accordance with a time delay inherent in an implementation level; a verification delay assigning circuit data code that causes the computer to emulate a verification delay assigning circuit being for assigning a predetermined fixed time delay to the input signal by being selected as the delay circuit in a logic verification operation of the integrated circuit; and a verification code that causes the computer to conduct logic verification directed to the integrated circuit, based on the verification delay assigning circuit emulated as the delay circuit.

An arrangement is also possible in which the verification delay assigning circuit data code defines, as undefined, an output signal value for another integrated circuit connected to the verification delay assigning circuit when the variable delay assigning circuit is selected as the delay circuit, and the variable delay assigning circuit data code defines an output signal value for another integrated circuit connected to the variable delay assigning circuit as a value equal to the input signal or a reverse value of the input signal when the verification delay assigning circuit is selected as the delay circuit An arrangement is also possible in which the verification delay assigning circuit data code defines, as undefined, an output signal value for another integrated circuit connected to the verification delay assigning circuit when the variable delay assigning circuit is selected as the delay circuit and the input signal is a pulse signal that takes both values of positive logic and negative logic, and the variable delay assigning circuit data code defines an output signal value for another integrated circuit connected to the variable delay assigning circuit as a value equal to the input signal or a reverse value of the input signal when the verification delay assigning circuit is selected as the delay circuit, or when the variable delay assigning circuit is selected and the input signal is maintained as a certain value.

The program may further include a selection circuit data code that causes the computer to emulate a selection circuit being for supplying the input signal to one of the variable delay assigning circuit and the verification delay assigning circuit.

The program may further include an output signal detection circuit data code that causes the computer to emulate an output signal detection circuit being for detecting presence or absence of a signal outputted via the variable delay assigning circuit and the verification delay assigning circuit.

The output signal detection circuit data code may define an output signal value for the output signal detection circuit as a value equal to the input signal or a reverse value of the input signal, even when one of the variable delay assigning circuit and the verification delay assigning circuit is selected as the delay circuit.

According to the third aspect of the present invention, there is provided a logic verification method used for device data including circuit data defining both of a function of assigning, to an input signal, a variable time delay varied within a predetermined range in accordance with a time delay inherent in an implementation level, and a function of assigning a predetermined fixed time delay to the input signal, the logic verification method including: a function selection step of selecting a function of assigning the predetermined fixed time delay in the circuit data; and a verification step of performing logic verification with use of the function selected in the function selection step.

According to the fourth aspect of the present invention, there is provided a test method for performing selection and/or logic verification of an integrated circuit having a variable delay circuit, the variable delay circuit including: a variable delay assigning section assigning, to an input signal, a variable time delay varied within a predetermined range in accordance with a time delay inherent in an implementation level; and a verification delay assigning section assigning a predetermined fixed time delay to the input signal, the test method including: a selection step of selecting the verification delay assigning section in the variable delay circuit; and a test step of performing the selection or the logic verification while using an electric signal of lower speed than in an actual operation and while delaying the input signal directed to the variable delay circuit by an amount of the predetermined fixed time delay by the verification delay assigning section.

According to the fifth aspect of the present invention, there is provided an electronic device equipped with an electronic circuit capable of operating at a plurality of different operation speeds, the electronic device including: a delay circuit that gives time delay of different lengths to an input signal of the electronic circuit, in accordance with the operation speeds.

The delay circuit may give time delay of relatively different lengths to a plurality of the input signal, in accordance with the operation speeds.

The delay circuit may include: a variable delay assigning section that outputs, in an actual operation of the electronic device, an input signal to a second device within the electronic circuit by being delayed by a first time delay that is varied according to characteristics of the electronic device, the input signal having been inputted either from an outside input terminal of the electronic device or from a first device win the electronic circuit; and a low-speed operation delay assigning section that outputs, in low-speed operation of the electronic device, the input signal to the second device within the electronic circuit by being delayed by a second time delay having been pre-set.

Here, the low-speed operation delay assigning section may delay the input signal by the second tie delay, in the case of low-speed logic verification or a low-speed test of the electronic device.

An arrangement is also possible in which the delay circuit further includes a test mode input terminal that inputs a test mode signal for designating the low-speed logic verification or the low-speed test with respect to the electronic device, and the low-speed operation delay assigning section outputs the input signal to the second device by being delayed by the second time delay, when the test mode signal has been inputted from the test mode input terminal.

An arrangement is also possible in which the delay circuit flier includes a test register that sets a test mode in which the electronic device is subjected to the low-speed logic verification or the low-speed test, and the low-speed operation delay assigning section outputs the input signal to the second device by being delayed by the second time delay, when the test mode has been set in the test register.

The low-speed operation delay circuit may delay the input signal by a fixed time delay, in the low-speed operation of the electronic device.

The above-stated summary does not list all the features essential for the present invention, and sub-combination of the mentioned groups of features may also be considered as the inventions.

DESCRIPTION OF EXEMPLARY EMBODIMENTS

As follows, a variable delay circuit, a recording medium, a logic verification method, and a test method according to the present invention are described based on preferred embodiments (hereinafter simply "embodiment") according to which they are implemented. It is needless to say that the following embodiments do not limit the scope of the present invention. In addition, "low-speed verification" of a variable delay circuit found in the following description is an expression is meant to indicate general low-speed operations performed with use of an electric signal of lower speed (lower frequency) than that of an electric signal used for actual operations, and so for example includes both of a low-speed selection test and low-speed logic verification.

First Embodiment

Figure 1:
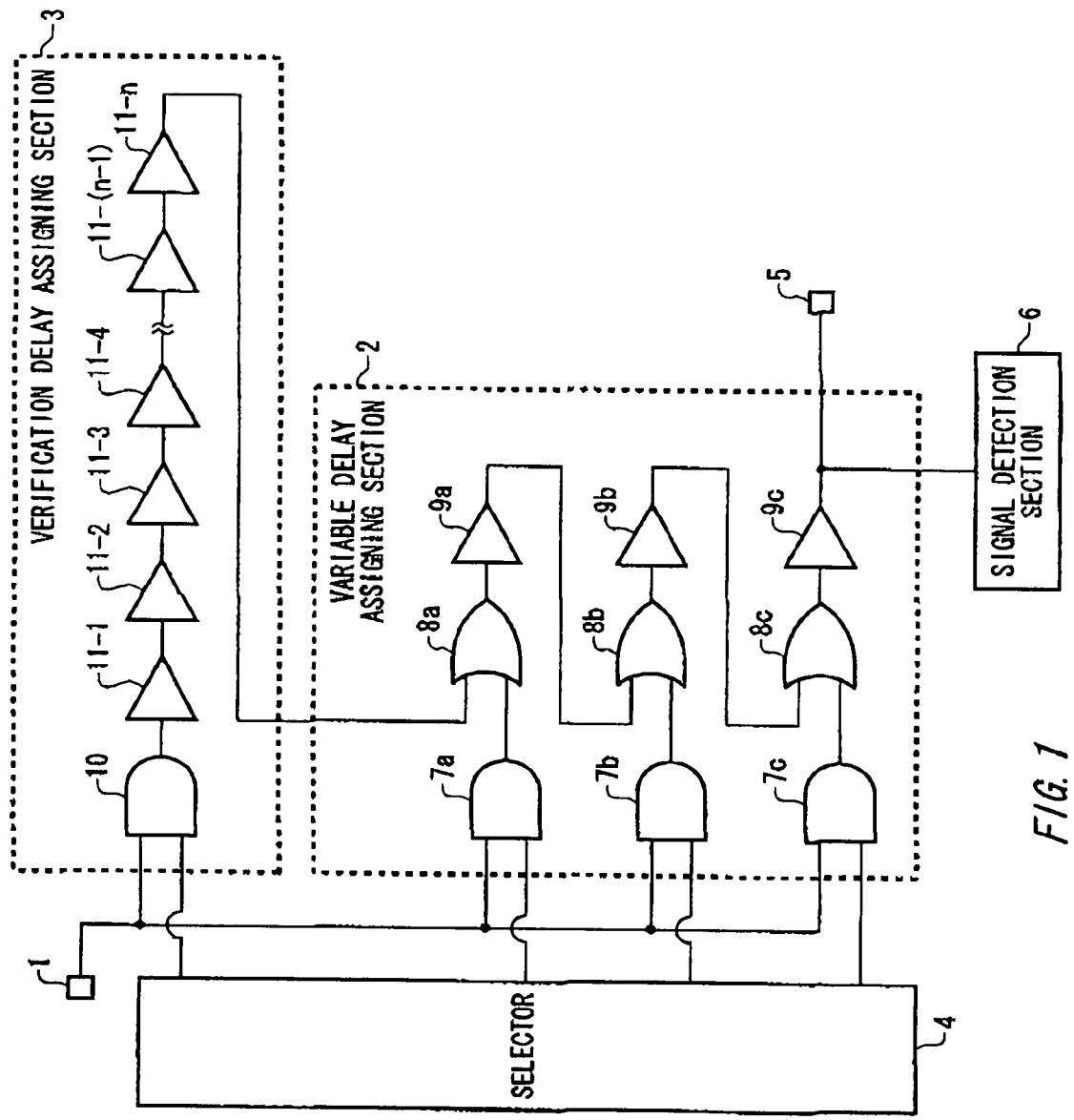
FIG. 1 is a schematic diagram showing a configuration of a variable delay circuit relating to the first embodiment.

First, a variable delay circuit according to the first embodiment is described. FIG. 1 is a schematic circuitry diagram illustrating a configuration of the variable delay circuit concerning the present embodiment. Note that the first embodiment defines the variable delay circuit as a combination of certain gate circuits as also shown in FIG. 1. However, needless to say, the variable delay circuit actually formed on a semiconductor substrate and so on is made up of concrete circuit devices (e.g. transistors) that realize the gate circuits as shown in such drawings as FIG. 1.

As shown in FIG. 1, the variable delay circuit according to the present embodiment includes: an input terminal 1 for signal inputting; a variable delay assigning section 2 for assigning a predetermined time delay to an input signal by being selected in an actual operation; a verification delay assigning section 3 for assigning a predetermined time delay to an input signal by being selected in a low-speed verification operation; a selector 4 for selecting either one of the variable delay assigning section 2 and the verification delay assigning section 3; an output terminal 5 for outputting, to other circuit devices, an input signal having been assigned a time delay by the variable delay assigning section 2 and the verification delay assigning section 3; and a signal detection section 6 for detecting presence or absence of output of an input signal assigned a time delay by the variable delay assigning section 2 and the verification delay assigning section 3.

The variable delay assigning section 2 receives input of a predetermined signal via the input terminal 1 in an actual operation, and is operable to assign a time delay that can be varied within a predetermined range. Specifically, the variable delay assigning section 2 includes: AND circuits 7a-7c, one input side terminal of each AND Circuit being connected to the input terminal 1 and the other input side terminal being connected to the selector 4; OR circuits 8a-8c, one input side terminal of each OR circuit being connected to an output side terminal of a respective one of the AND circuits 7a-7c; and delay circuits 9a-9c connected to the output side terminals of the OR circuits 8a-8c. Moreover, the other input side terminal of the OR circuit 8a is connected to the output side terminal of the delay circuit 11-n detailed later, while the other input side terminals of the OR circuits 8b and 8c are connected to the output side terminals of the delay circuits 9a and 9b, respectively. Note that as also made clear from the later explanation, the delay circuits 9a-9c included in the variable delay assigning circuit 2 function also when the verification delay assigning section 3 assigns a time delay, and so in a strict sense, the delay circuits 9a-9c also have a function as the verification delay assigning section 3. However, for facilitating understanding of the present invention, the delay circuits 9a-9c are explained below as part of the variable delay assigning section 2 for the sake of convenience.

The verification delay assigning section 3 is used in a low-speed test for an integrated circuit, and is operable to assign a larger time delay than the maximum value of the time delay assigned by the variable delay assigning section 2. Concretely, the verification delay assigning section 3 includes: an AND circuit 10 whose input side terminals are connected with the input terminal 1 and the selector 4; and delay circuits 11-1-11-n (where n is a natural number) being sequentially serially connected to an output side terminal of the AND circuit 10. Time delays assigned by the delay circuits 9a-9c and by the delay circuits 11-1-11-n shown in FIG. 1 may be different values from one another, but are assumed to be Δt in the following explanation for the sake of simplicity.

The selector 4 is operable to select either one of the variable delay assigning section 2 and the verification delay assigning section 3, as a constituting element for assigning a delay to a signal inputted through the input terminal 1. When the variable delay assigning section 2 is selected, the selector 4 is further operable to select a time delay. Concretely, the selector 4 is configured to output a selection signal to one of the input side terminals of the AND circuits 7a-7c and the AND circuit 10, and is operable to perform a selection operation according to the selection signal. Note that the selector 4 is explained as being included in the variable delay circuit in the first embodiment. However, such a selector may not be provided in the variable delay circuit of the first embodiment, and instead a configuration is possible by which a selection signal is directly inputted from a predetermined external circuit. Furthermore in the first embodiment, it is assumed that the selection operation of the selector 4 is performed in accordance with a control signal inputted from outside.

The signal detection section 6 is for detecting a signal assigned a delay via the variable delay assigning section 2 or via the verification delay assigning section 3. Specifically, the signal detection section 6 is operable to determine presence or absence of broken wire in the variable delay circuit, for example by allowing passage of a signal within the variable delay circuit via the variable delay assigning section 2 and the verification delay assigning section 3 thereby checking whether the signal is outputted to the output terminal 5. The signal detection section 6 is also operable to confirm presence or absence of a short circuit within the variable delay circuit, by detecting presence or absence of a signal while neither the variable delay assigning section 2 nor the verification delay assigning section 3 has been selected. Note that the signal detection section 6 is explained as being included in the variable delay circuit in the first embodiment, however may alternatively be separately provided outside the variable delay circuit.

Next, the operation performed by the variable delay circuit according to the present embodiment is described. In the following explanation, the operation of the variable delay circuit is explained for both cases where an integrated circuit incorporating the variable delay circuit is actually operated (hereafter occasionally simply "in (the) actual operation") and where the integrated circuit undergoes a low-speed verification operation (hereafter occasionally simply "in (the) low-speed verification (operation)").

Figure 2:
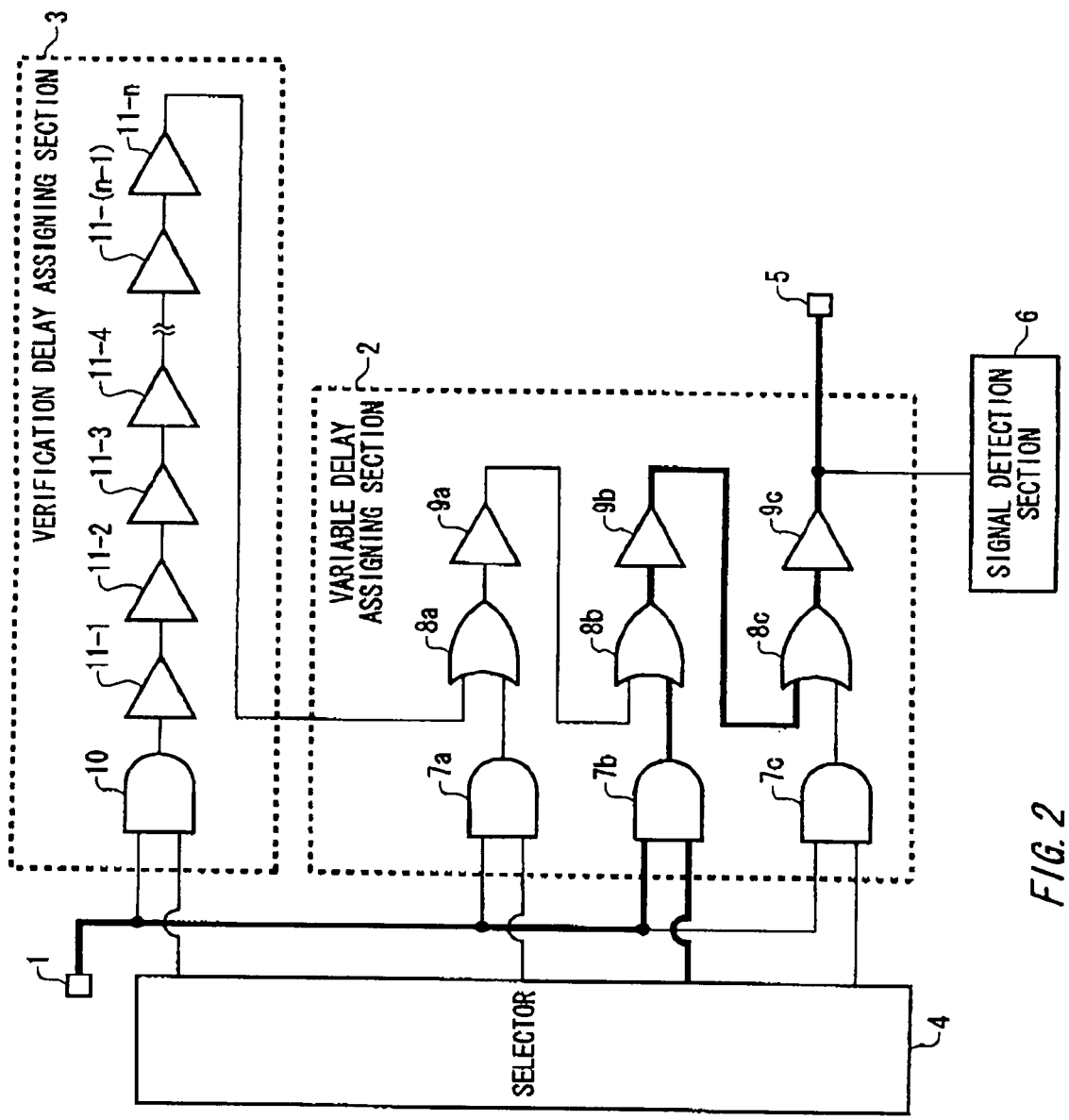
FIG. 2 is a schematic diagram showing an operation mode of a variable delay circuit in actual operation.

FIG. 2 is a schematic diagram showing the operation mode of the variable delay circuit in the actual operation. In the actual operation, the variable delay Circuit according to the first embodiment absorbs the effect of time delay having been caused unexpectedly attributable to process variations or the like in the implementation level. For this purpose, the concrete value of the time delay is adjusted by outputting a selection signal from the selector 4 to the variable delay assigning section 2, and further by adjusting an output destination of the selection signal.

FIG. 2 shows a state in which a selection signal is supplied to the AND circuit 7b out of the output destinations of a selection signal within the variable delay assigning section 2. A signal such as a clock signal or a data signal is inputted to one input side terminal of the AND circuit 7b from outside via the input terminal 1 (for simplicity, always 1 is assumed to be outputted). Accordingly, by supplying a selection signal to the other input side terminal of the AND circuit 7b, the same signal as the signal inputted via the input terminal 1 will be outputted from the output side terminal of the AND circuit 7b. Subsequently, the signal inputted via the input terminal 1 passes through the OR circuit 8b, the delay circuit 9b, the OR circuit 8c, and the delay circuit 9c, and is finally outputted to outside via the output terminal 5. Consequently, in the example of FIG. 2, the signal inputted via the input terminal 1 will be assigned a delay by the delay circuits 9b and 9c. This means that by setting Δt as the time delay assigned by each delay circuit, the time delay to be assigned in the example of FIG. 2 is 2Δt.

The same operation will be performed when the selector 4 selects either the AND Circuit 7a or the AND circuit 7c. More specifically, when a selection signal is supplied to the AND circuit 7a, the signal inputted via the input terminal 1 will sequentially pass through the AND circuit 7a, the OR circuit 8a, the delay circuit 9a, the OR circuit 8b, the delay circuit 9b, the OR circuit 8c, and the delay circuit 9c, to be finally outputted. Consequently, the signal inputted via the input terminal 1 will pass through the delay circuits 9a-9c, and so the delay to be assigned will be 3Δt. When a selection signal is supplied to the AND circuit 7c from the selector 4, the signal inputted via the input terminal 1 will pass through the AND circuit 7c, the OR circuit 8c, and the delay circuit 9c, and so a delay of Δt will be assigned by means of the delay circuit 9c.

In this way, by supplying a selection signal to one of the AND circuits 7a-7c included in the variable delay assigning section 2, it becomes possible to change the time delay to be assigned to a signal inputted via the input terminal 1. According to such a function, the variable delay circuit according to the first embodiment prevents a problem where time delay caused on irregular basis attributable to process variations or the like in the implementation level adversely affects the operation of the entire integrated circuit.

For example, suppose a case where the variable delay circuit according to the first embodiment implemented on an integrated circuit has been designed to assign a time delay of 3Δt in the designing stage, however a time delay of Δt has occurred in the external wiring due to manufacturing variations or the like in the implementation level which has not been designed. In such a case, the selector 4 outputs a selection signal to the AND circuit 7b included in the variable delay assigning section 2, to generate a time delay of 2Δt for assigning purpose. Consequently, the time delay of 3Δt equal to the designed value is able to be assigned as a whole, thereby eliminating the effect of manufacturing variations and the like. It should be kept in mind that the concrete value of the time delay caused by manufacturing variations or the like is normally unknown. In view of this, adjustment of time delay practically performed is to input a test signal via the input terminal 1, sequentially switch between the supply destinations of a selection signal outputted from the selector 4 thereby assigning a variable time delay.

The following describes the operation of the variable delay circuit in the low-speed verification according to the first embodiment. The low-speed verification is a verification operation performed by driving the integrated circuit at a lower speed than in the actual operation. The low-speed verification intends to check a logic connection between each circuit formed on an integrated circuit and so on prior to performing verification in operation level, and so corresponds to logic verification during the designing stage.

Figure 3:
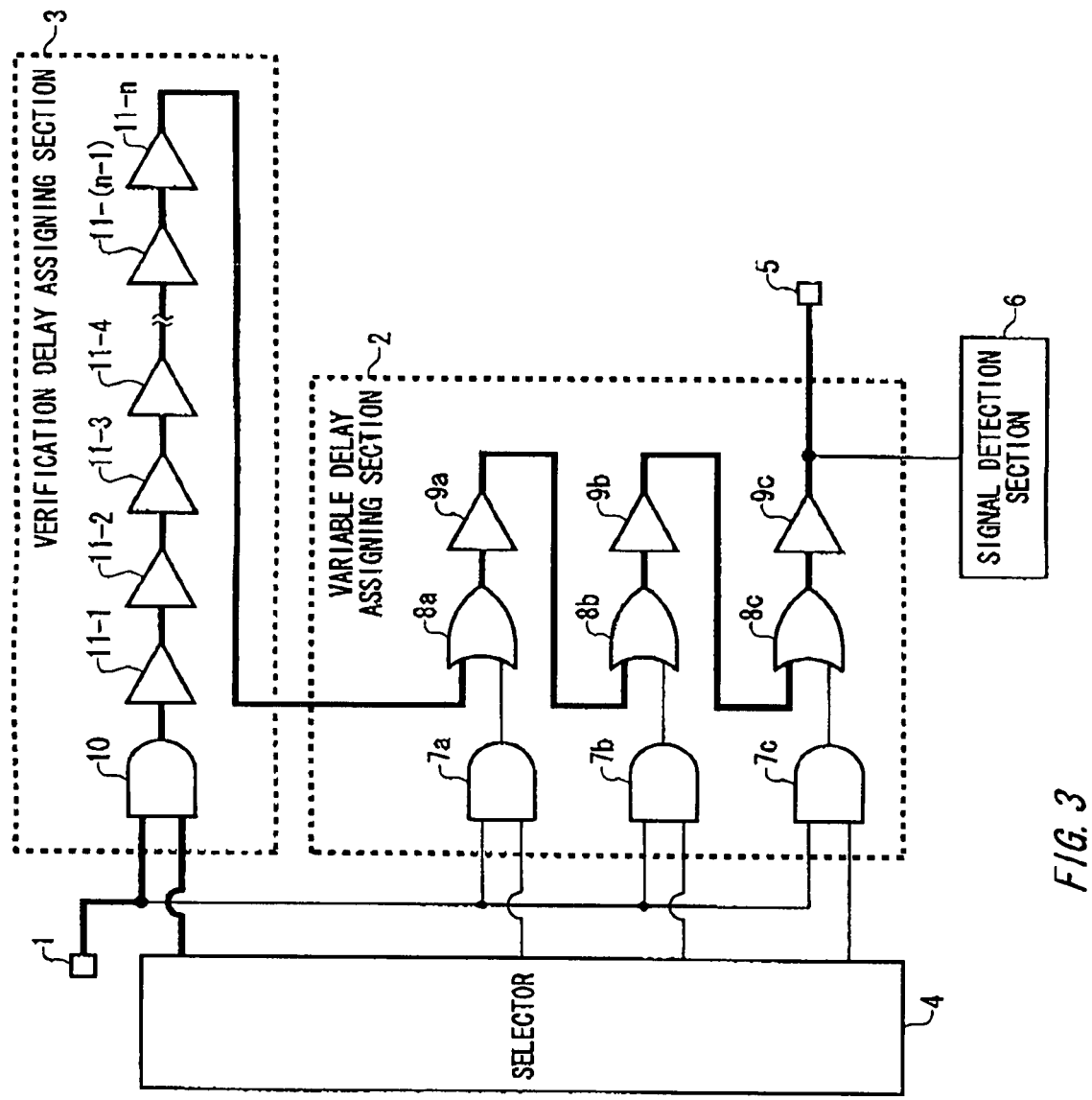
FIG. 3 is a schematic diagram showing an operation mode of a variable delay circuit in low-speed verification.

FIG. 3 is a schematic diagram showing an operation mode of the variable delay circuit in the low-speed verification. As shown in FIG. 3, in the low-speed verification, the selector 4 supplies a selection signal to one input side terminal of the AND circuit 10 included in the verification delay assigning section 3. Since a signal is inputted to the other input side terminal of the AND circuit 10 via the input terminal 1, the same signal as the signal inputted via the input terminal 1 is outputted from an output side terminal of the AND circuit 10. The signal having passed the AND circuit 10 thereafter sequentially passes the delay circuits 11-1-11-n, the OR circuit 8a, the delay circuit 9a, the OR circuit 8b, the delay circuit 9b, the OR circuit 8c, and the delay circuit 9c, and is finally outputted to outside via the output terminal 5, as also shown in FIG. 3.

Consequently, by supplying a selection signal to the AND circuit 10 included in the verification delay assigning section 3, a signal inputted via the input terminal 1 will be assigned a predetermined time delay by the delay circuits 11-1-11-n and the delay circuits 9a-9c. Concretely, the time delay of (n+3)Δt will be assigned. This value stays constant as long as a selection signal is supplied to the AND circuit 10 included in the verification delay assigning section 3. In this sense, the verification delay assigning section 3 is operable to assign a certain amount of time delay to a signal inputted via the input terminal 1.

The following describes advantages of the variable delay circuit according to the first embodiment. As mentioned above, conventional variable delay circuits have low accuracy in low-speed verification because the amount of time delay to be assigned is variable. Concretely, there are such cases where the low-speed verification by conventional variable delay circuits finds an integrated circuit as a defective item even if the integrated circuit can operate without trouble in reality.

As opposed to this, the variable delay circuit according to the first embodiment is equipped with the verification delay assigning section 3 used in low-speed verification and operable to assign a predetermined fixed time delay, in addition to the variable delay assigning section 2 operable to realize original functions of a variable delay circuit. By selecting the verification delay assigning section 3 in the low-speed verification, as a constituting element for assigning a time delay to an input signal, the variable delay circuit according to the first embodiment is able to precisely detect logic defects in the low-speed verification.

Figure 4:
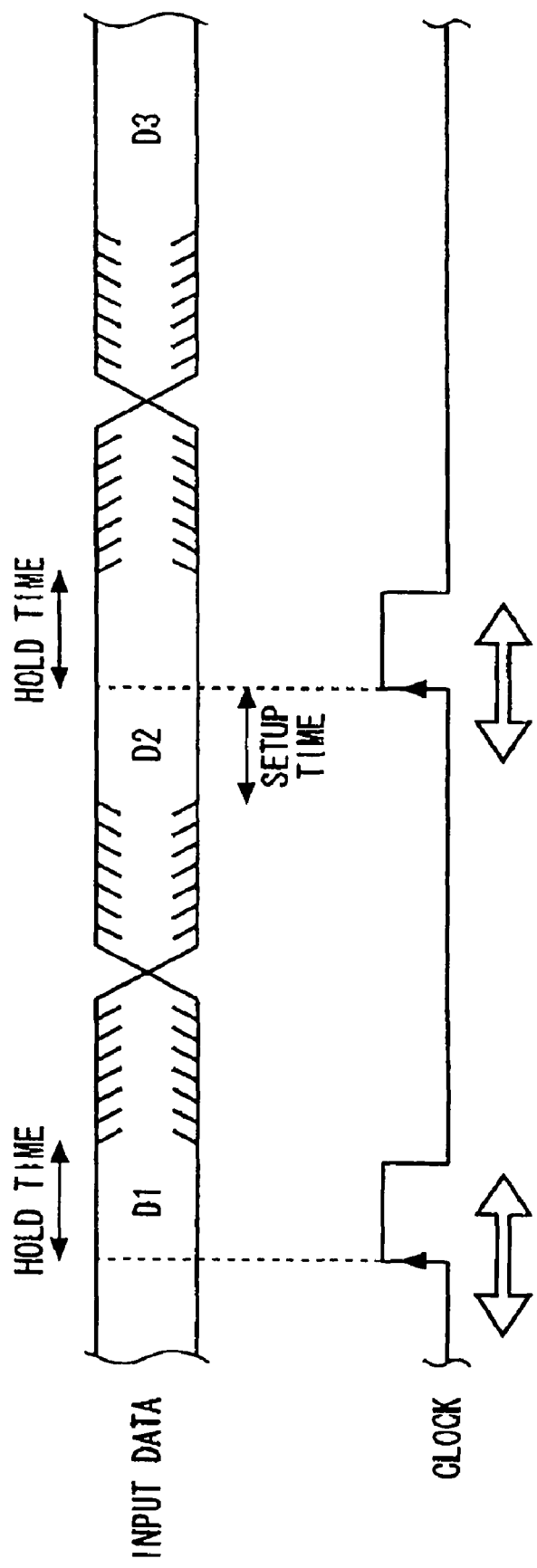
FIG. 4 is a schematic diagram for explaining advantages of a variable delay circuit.
Figure 9:
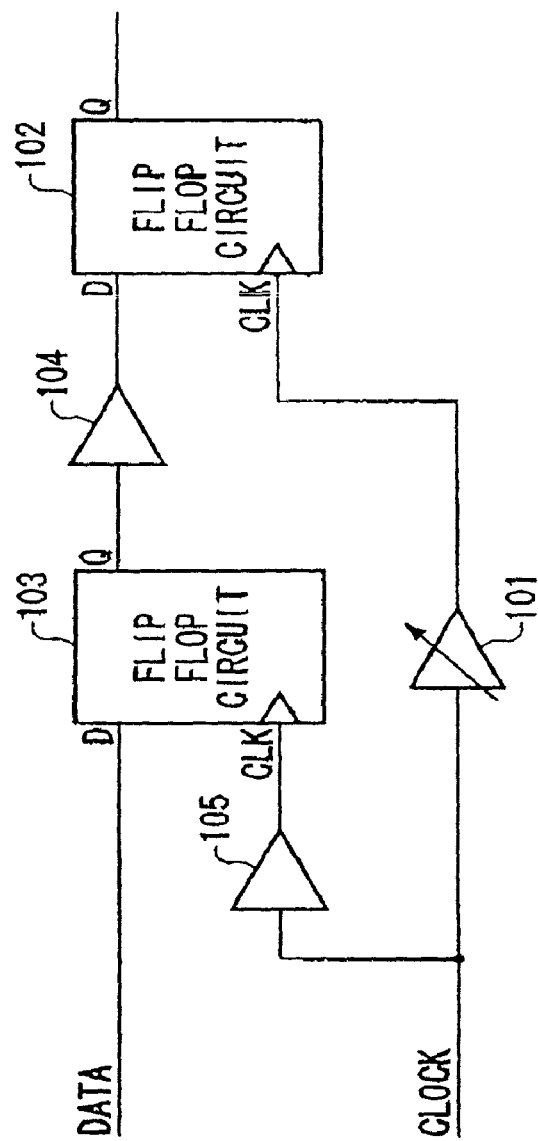
FIG. 9 is a schematic diagram showing one example of a circuit configuration that uses a conventional variable delay circuit.

FIG. 4 is a time chart showing input data and an operation clock inputted to the flip-flop circuit 102, in case where the variable delay circuit according to the first embodiment is adopted to a circuit configuration shown in FIG. 9. As shown in the first embodiment, the verification delay assigning section 3 assigns a predetermined fixed time delay to a clock that passes the variable delay circuit. Accordingly, it becomes possible to maintain a setup time and a hold time that are constant and sufficient, with respect to the input data inputted to the flip-flop circuit 102, as shown in FIG. 4. Therefore, by employing the variable delay circuit according to the first embodiment, circuit operation in low-speed verification will not have problems attributable to timing lag between input data inputted to the flip-flop circuit 102 and the clock defining the driving timing of the flip-flop circuit 102. Accordingly, it becomes possible to avoid such problems as misjudging non-defective items as defective.

It should be noted here that the concrete value of time delay to be assigned by the verification delay assigning section 3 is to be defined by the structure of a corresponding integrated circuit and so on, however is preferably set as a larger value than the maximum possible value of time delay assignable by the variable delay assigning section 2. By adopting the described configuration, such advantages will arise as being able to maintain a sufficient hold time, in the circuit structure example of FIG. 9. Furthermore, the concrete value of time delay may alternatively be smaller than the minimum possible value of time delay assignable by the variable delay assigning section 2.

In addition, the variable delay circuit according to the first embodiment is configured to include the signal detection section 6, in the preceding stage of the output terminal 5, for detecting presence or absence of a signal to be outputted via the output terminal 5. By having the described configuration, it becomes possible to detect such defects that signal outputting is not performed even if operations under way in the variable delay circuit assume such signal outputting, or that signal outputting is performed even if operations in the variable delay circuit under way do not assume such signal outputting. Accordingly, the first embodiment presents an advantage of allowing the variable delay circuit implemented on an integrated circuit to perform the verification operation at the conductive level.

Furthermore, by having the above configuration, the variable delay circuit according to the first embodiment is able to conduct a test method such as simple and accurate low-speed logic verification and/or low-speed selection of defective item. To be more specific, in conducting a test method, the verification delay assigning section 3 is selected from between the variable delay assigning section 2 and the verification delay assigning section 3. Then while inputting an electric signal of lower speed than in the actual operation via the input terminal 1, the variable delay circuit delays the inputted electric signal by a predetermined fixed value with use of the verification delay assigning section 3. Accordingly, it becomes possible to perform low-speed logic verification and/or low-speed selection.

Second Embodiment

Next, a variable delay circuit according to the second embodiment is described. The variable delay circuit according to the second embodiment has a variable delay assigning section 2 and a verification delay assigning section 3 just as in the first embodiment, except that the selector is divided into a portion that switches the time delay value in operating the variable delay assigning section 2 and a portion that controls whether to drive the verification delay assigning section 3, and has a configuration of inputting a predetermined signal for verification operations of the conductive level.

Figure 5:
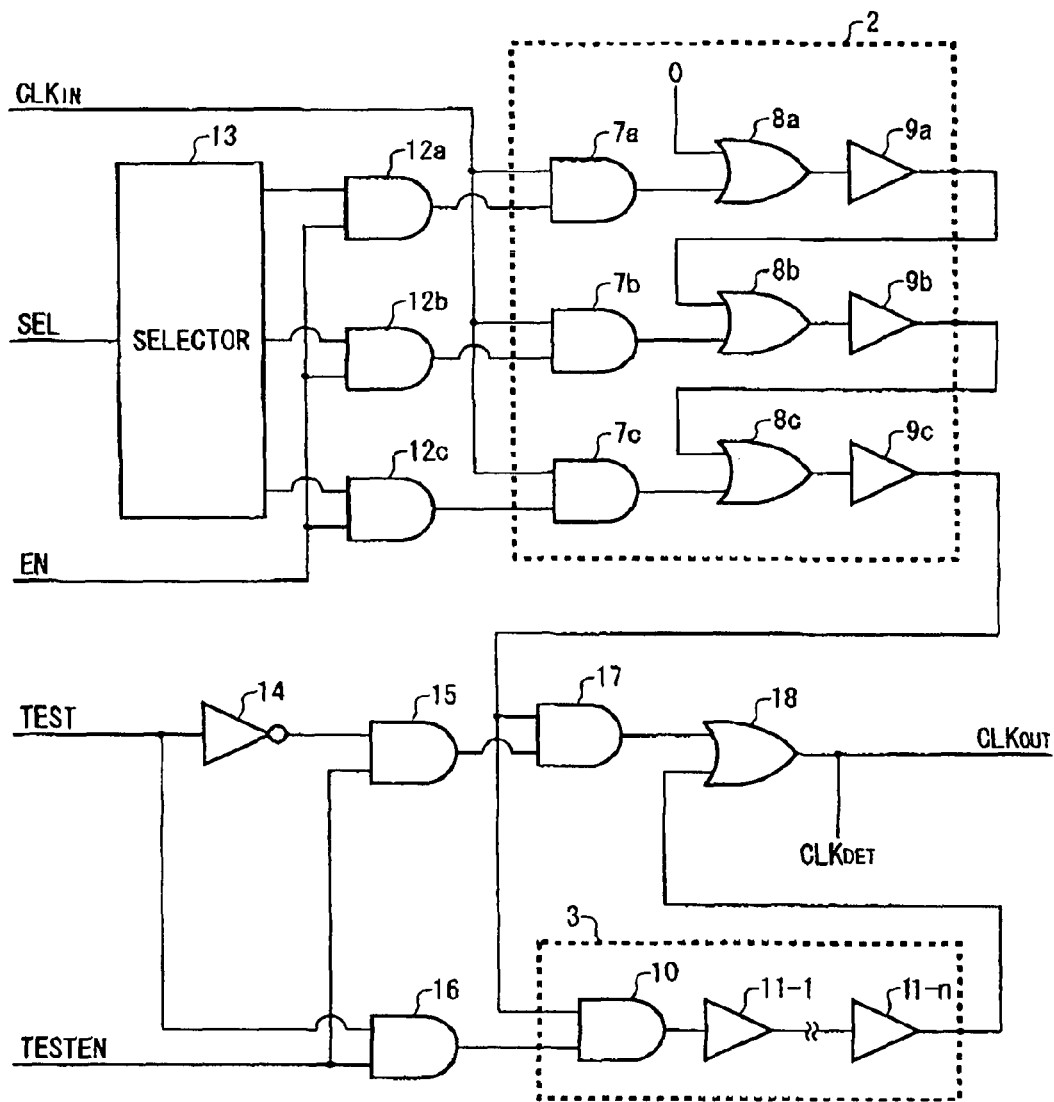
FIG. 5 is a schematic diagram showing a configuration of a variable delay circuit relating to the second embodiment.

FIG. 5 is a schematic diagram showing a configuration of the variable delay circuit according to the second embodiment. As shown in FIG. 5, the variable delay circuit according to the second embodiment includes: AND circuits 12a-12c, an output side terminal of each AND circuit 12a-12c being connected to one input side terminal of a respective one of the AND circuits 7a-7c included in the variable delay assigning section 2; and a selector 13 connected to one input side terminal of each of the AND circuits 12a-12c, and has a configuration of supplying an EN signal from outside to the other input side terminals of the AND circuits 12a-12c.

An EN signal is supplied to input side terminals of the AND circuits 12a-12c. Accordingly, if an EN signal is inputted as well as a selection signal inputted from the selector 13, the AND circuits 12a-12c will output a selection signal to the AND circuits 7a-7c included in the variable delay assigning section 2. If no EN signal is inputted, on the other hand, none of the AND circuits 12a-12c will be brought ON, and so the variable delay assigning section 2 will not be selected regardless of presence or absence of a selection signal supply from the selector 13.

Moreover, in the variable delay circuit according to the second embodiment, the configuration of the verification delay assigning section 3 and its periphery is different from its counterpart in the first embodiment. Specifically, one input side terminal of the AND circuit 10 in the verification delay assigning section 3 is connected to the output side terminal of the delay circuit 9c included in the variable delay assigning section 2, and the other input side terminal of the AND circuit 10 is connected to the output side terminal of a new AND circuit 16. The AND circuit 16 is configured so that a TEST signal is inputted to one input side terminal thereof, and a TESTEN signal is inputted to the other input side terminal thereof.

Furthermore, the output side terminal of the delay circuit 11-n included in the verification delay assigning section 3 is configured to be connected to one input side terminal of the OR circuit 18. The other input side terminal of the OR circuit 18 is connected to the AND circuit 17. One input side terminal of the AND circuit 17 is connected to the output side terminal of the delay circuit 9c included in the variable delay assigning section 2, and the other input side terminal of the AND circuit 17 is connected to the output side terminal of the AND circuit 15. The AND circuit 15 is configured so that a TESTEN signal is inputted to one input side terminal thereof, and the other input side terminal of the AND circuit 15 is connected to the output side terminal of the NOT circuit 14 and a reverse signal of a TEST signal is supplied to the other input side terminal of the AND circuit 15.

A TEST signal is a signal for driving the verification delay assigning section 3 in low-speed verification. A TESTEN signal is provided to perform an inspection of the conductive level, just as an EN signal. More specifically, while no TESTEN signal is supplied, the verification delay assigning section 3 will not be selected regardless of presence or absence of a TEST signal, preventing the delay circuits 11-1-11-n from assigning time delay to a signal inputted from outside.

The operation performed by the variable delay circuit according to the second embodiment is described. Firstly in the actual operation, a SEL signal is outputted to the selector 13, and an EN signal is outputted to the AND circuits 12a-12c. In addition, a TEST signal is brought OFF, while a TESTEN signal is supplied to the AND circuits 15 and 16.

Due to the supply mode of these control signals, the variable delay circuit according to the second embodiment acts onto an input signal ($CLK_{IN}$ signal in FIG. 5) in the following manner. A selection signal is supplied from the selector 13 through either of the AND circuits 12a-12c to one input side terminal of a corresponding one of the AND circuits 7a-7c. Since the $CLK_{IN}$ signal outputted from outside is supplied to the other input side terminals of the AND circuit 7a-7c, the $CLK_{IN}$ signal passes through either of the AND circuits 7a-7c according to the contents of the selection signal from the selector 13, and is assigned a predetermined time delay by the variable delay assigning section 2, just as in the case of the first embodiment.

In addition, since the TEST signal is brought OFF, the AND circuit 16 is also brought OFF. A TEST signal having undergone reversal by the NOT circuit 14 and a TESTEN signal are supplied to the AND circuit 15, and the AND circuit 15 outputs a predetermined signal to one input side terminal of the AND circuit 17. A $CLK_{IN}$ signal that is assigned a predetermined time delay by the delay circuit 9c is supplied to the other input side terminal of the AND circuit 17, thereby bringing the AND circuit 17 ON. The $CLK_{IN}$ signal that is assigned a time delay passes through the AND circuit 17 and the OR circuit 18, and is outputted as a $CLK_{OUT}$ signal to be outputted outside and a $CLK_{DET}$ signal to be outputted to the signal detection section.

Next, the operation performed by the variable delay circuit in low-speed verification is described. In low-speed verification, not only a TESTEN signal and an EN signal are supplied, a TEST signal is also outputted. Therefore, the AND circuit 15 is brought OFF while the AND circuit 16 is brought ON. Accordingly, the $CLK_{IN}$ signal inputted via the delay circuit 9c passes the verification delay assigning section 3 and the OR circuit 18, and is outputted as a $CLK_{OUT}$ signal and a $CLK_{DET}$ signal. Note that in low-speed verification operation, so as to allow the $CLK_{IN}$ signal to reach the AND circuit 10, a predetermined SEL signal is supplied thereby allowing the $CLK_{IN}$ signal to pass through either of the AND circuits 7a-7c to be inputted to the verification delay assigning section 3. However, the described operation does not indicate that the verification delay assigning section 2 is exercising its function, but rather should be perceived as being performed in view of maintaining a passage path for the $CLK_{IN}$ signal. Accordingly, in low-speed verification operation, the contents of the SEL signal is to continue selecting either one of the AND circuits 7a-7c from the beginning to the ending of the verification operation, so that the variable delay circuit according to the second embodiment strictly assigns a certain fixed time delay to an input signal in the low-speed verification operation.

By operating in the above way, the variable delay circuit according to the second embodiment assigns a variable time delay in the actual operation, while being able to assign a predetermined time delay in the low-speed verification, just as in the first embodiment. Accordingly, verification errors are not caused in the low-speed verification, and it is possible to present an advantage of avoiding such a problem as misjudging, as defective, a non-defective integrated circuit incorporating the variable delay circuit.

Furthermore, the variable delay circuit according to the second embodiment is able to conduct verification at the conductive level by performing control by means of an EN signal and a TESTEN signal. That is, by bringing the EN signal and the TESTEN signal to OFF, the variable delay circuit according to the second embodiment is able to stop output of a signal regardless of the contents of the TESTEN signal and the SEL signal. By detecting presence or absence of the $CLK_{DET}$ signal under such a setting, it becomes possible to detect whether a short circuit has occurred inside the variable delay circuit.

Third Embodiment

Next, macrocell data according to the third embodiment is described. The macrocell data according to the third embodiment is a definition about the variable delay circuit having the function described in the first embodiment and the second embodiment. More specifically, the macrocell data is used in designing an integrated circuit and defines a time delay function for device data corresponding to the integrated circuit. The macrocell data is configured to include variable delay assigning circuit data, verification delay assigning circuit data, and selection circuit data, which respectively correspond to the variable delay assigning section, the verification delay assigning section, and the selector explained in the first embodiment and the second embodiment.

As mentioned above, conventional variable delay circuits cause problems in the low-speed verification performed after being actually incorporated in corresponding integrated circuits. However, such problems can also be found in the logic verification in the designing stage. Specifically, for example if logic verification is conducted to a circuit that is designed up to the gate circuit level and incorporates therein a conventional variable delay circuit, such a problem is caused that a logic defect cannot be detected with accuracy. It is possible to solve the mentioned problem by assigning new circuit data that corresponds to a verification delay assigning section, with respect to a variable delay circuit defined in the designing stage, applying the concept as set forth in the first embodiment and the second embodiment.

So as to realize such a variable delay circuit as designed in the above way in the logic level, it is more advantageous in terms of lessening the designing burden to perform modularization as macrocell data such as a flip-flop circuit, an adder, and a counter, instead of working by hand for each designing. The macrocell data according to the third embodiment is realized based on such a concept.

It should be noted that in the following description, the macrocell data according to the third embodiment is explained as reflecting the function of the variable delay circuit according to the second embodiment. However, as also explained later, the macrocell data according to the third embodiment should not be construed as limited to such a configuration.

The macrocell data according to the third embodiment defines, as a logic specification, a $CLK_{IN}$ signal, an EN signal, a TESTEN signal, a TEST signal, and a SEL signal, as input signals, just as in the variable delay circuit according to the second embodiment. The macrocell data according to the third embodiment also defines, as output signals, a $CLK_{OUT}$ signal and a $CLK_{DET}$ signal. The macrocell data according to the third embodiment defines the relationship between these input/output signals, by means of the logic circuit shown in FIG. 6.

Concretely, the macrocell data according to the third embodiment includes: an AND circuit 21 to which an EN signal and a TESTEN signal are inputted; a NOT circuit 22 that reverses a TEST signal; an AND circuit 23 to which a $CLK_{IN}$ signal as well as an output signal from the AND circuit 21 are inputted; and an AND circuit 24 to which an output signal from the AND circuit 21 and an output signal from the NOT circuit 22 are inputted. Furthermore, the macrocell data according to the third embodiment is equipped with a selector 25 for switching output signals according to the output signal from the AND circuit 24, while being configured to output an output signal from the AND circuit 23 as the $CLK_{DET}$ signal, thereby realizing switching between the values of the $CLK_{OUT}$ signal according to the value of the output signal from the AND circuit 24. Concretely, when the output signal from the AND circuit 24 is 0, the selector 25 sets the output signal from the AND circuit 23, as the $CLK_{OUT}$ signal just as the $CLK_{DET}$ signal. On the other hand, when the output signal from the AND circuit 24 is 1, the selector 25 operates to set the $CLK_{OUT}$ signal as X (Don't care).

Figure 6:
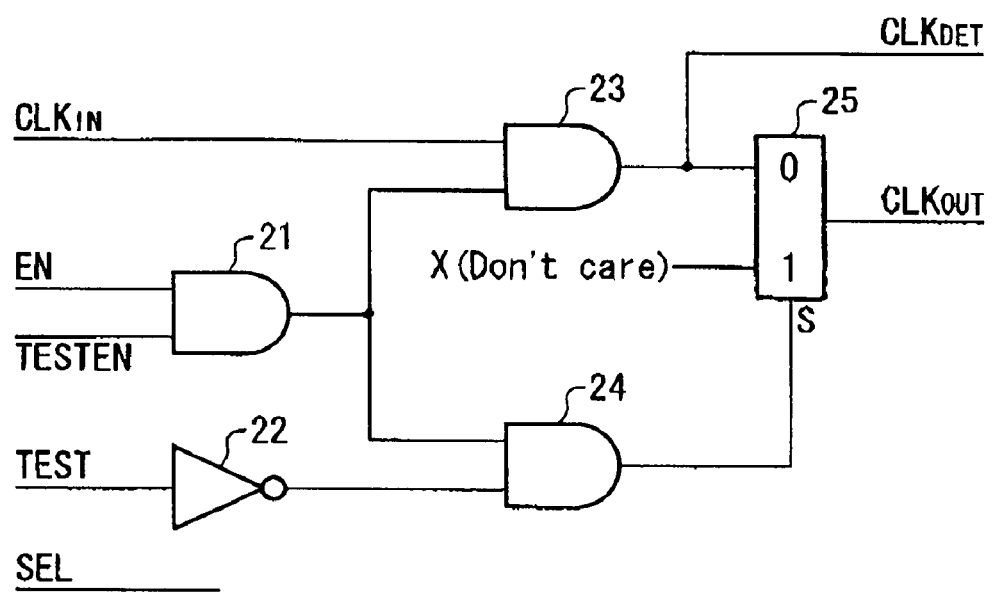
FIG. 6 is a schematic diagram showing a configuration of macrocell data relating to the third embodiment.

The following describes the relation between an input signal and an output signal, with use of the logic circuit shown in FIG. 6. First, since the variable delay assigning section does not need to adjust time delay in the logic verification, the value of the SEL signal will not be referenced by the macrocell data. In addition, by setting of the EN signal and the TESTEN signal as 1, the output signal from the AND circuit 21 will be 1, and therefore the AND circuit 23 will output 1 when the $CLK_{IN}$ signal becomes 1.

When the value of the TEST signal becomes 1 indicating driving of the verification delay assigning section, the NOT circuit 22 operates to input, to the AND circuit 24, the output 1 from the AND circuit 21 as well as the output 0 from the NOT circuit 22, thereby yielding the output from the AND circuit 24 of 0. Accordingly, 0 is supplied to the selector 25 from the AND circuit 24, and the output value of the AND circuit 23, i.e. 1, is outputted as the $CLK_{OUT}$ signal.

On the other hand, when the TEST signal is 0, the NOT circuit 22 operates to bring every signal inputted to the AND Circuit 24 to 1. Accordingly, 1 is supplied to the selector 25 from the AND circuit 24, and the selector 25 outputs X (Don't Care) as the $CLK_{OUT}$ signal.

The $CLK_{DET}$ signal is described as follows. As shown in FIG. 6, the value of the $CLK_{DET}$ signal is not affected by the operation of the selector 25, and therefore is determined regardless of the value of the TEST signal. Concretely, when the value of the $CLK_{IN}$ signal and the value of the output signal from the AND circuit 21 are both 1, the value of the $CLK_{OUT}$ signal will be 1, and otherwise, it will be 0. The case where the value of the output signal from the AND circuit 21 becomes 0 includes when both of the EN signal and the TESTEN signal are 0, which corresponds to the verification of the conductive level in the second embodiment.

Advantages of the macrocell data according to the third embodiment are described. First, by using the macrocell data according to the third embodiment, a designer is able to easily create device data that uses circuit data corresponding to the variable delay circuit according to the first and second embodiments, in designing an integrated circuit. That is, a designer is able to realize a variable delay circuit as macro defining a predetermined function, just as the other macrocell data, and so prompt circuit designing becomes possible without necessity to define concrete configurations every time designing is performed.

In addition, when the device data is generated with use of the macrocell data according to the third embodiment, an advantage of improving assuredness in logic verification is achieved. The following details such an advantage.

As described above, regarding the macrocell data according to the third embodiment, when the value of the TEST signal is 1, the value of the $CLK_{OUT}$ signal will be determined as a certain value according to the value of the $CLK_{IN}$ signal. On the other hand, when the value of the TEST signal is 0 (as long as the output value from the AND circuit 21 is 0), the value of the $CLK_{OUT}$ signal will be X.

Here, the TEST signal is for determining presence or absence of the action of the verification delay assigning section that functions in the logic verification, as already explained in the second embodiment. Concretely, when the TEST signal is 1, the $CLK_{IN}$ signal is outputted via the verification delay assigning section, while when the TEST signal is 0, the $CLK_{IN}$ signal is outputted in the state of being assigned a variable time delay by the variable delay assigning section, without passing through the verification delay assigning section.

As already mentioned, in the logic verification or in the low-speed verification, the logic verification or the like becomes uncertain if using a conventional variable delay circuit. In an actual variable delay circuit, an output signal will take a certain value, and the operation of the flip-flop circuit or the like positioned in the later stages and operated using the output signal becomes uncertain. Such uncertainty is attributable to the variable delay circuit.

Therefore, the first embodiment and the second embodiment adopt the configuration that uses the verification delay assigning section 3 separately in the low-speed verification, i.e. in the logic verification of the logic circuit level. Such a function is likewise adopted in the macro-module data according to the third embodiment. However, the possibility cannot be denied which, due to occurrence of error in the test pattern used for the logic verification, the function of the verification delay assigning section cannot be used even if during the logic verification and so the variable delay assigning section assigns a time delay not defined at a certain value for example.

Therefore, when the function of the verification delay assigning section cannot be used in the third embodiment, i.e. when logic verification is performed when the TEST signal is 0 in the macrocell data shown in FIG. 6, X is to be outputted as the $CLK_{OUT}$ signal. By adopting such a configuration, even when a test pattern for not using the function of the verification delay assigning section is used erroneously, it becomes possible to clarify that the erroneous logic defect is detected by setting the TEST signal as 0, by tracing according to a response result of the device data. This presents an advantage of improving the accuracy in logic verification.

As is clear from the above description, it should be noted that the concrete logic structure of the macrocell data according to the third embodiment should not be limited to as shown in FIG. 6. In other words, so as to enjoy the advantages of the macrocell data according to the third embodiment, it is sufficient if the logic specification is configured so that the variable delay assigning function and the verification delay assigning function are defined as a circuit function, and that in case when the variable delay assigning function is erroneously selected, X (Don't care) is to be outputted as the CLK$_{OUT}$ signal. Furthermore, preferably the logic specification is configured such that the CLK$_{DET}$ signal used for signal detection is set as the value of the CLK$_{IN}$ signal regardless of the selection mode, and that 0 is outputted when neither of the verification delay assigning function nor the variable delay assigning function functions, thereby realizing macrocell data presenting the above-mentioned advantages.

Fourth Embodiment

Next, macrocell data according to the fourth embodiment is described. The macrocell data according to the fourth embodiment includes: variable delay assigning circuit data; verification delay assigning circuit data; and selection circuit data, as a basic configuration just as in the third embodiment, and is further configured, as a logic specification, to change the contents of the CLK$_{OUT}$ signal according to the contents of the CLK$_{IN}$ signal when the TEST signal is 0, instead of always outputting X as the CLK$_{OUT}$ signal.

Figure 7:
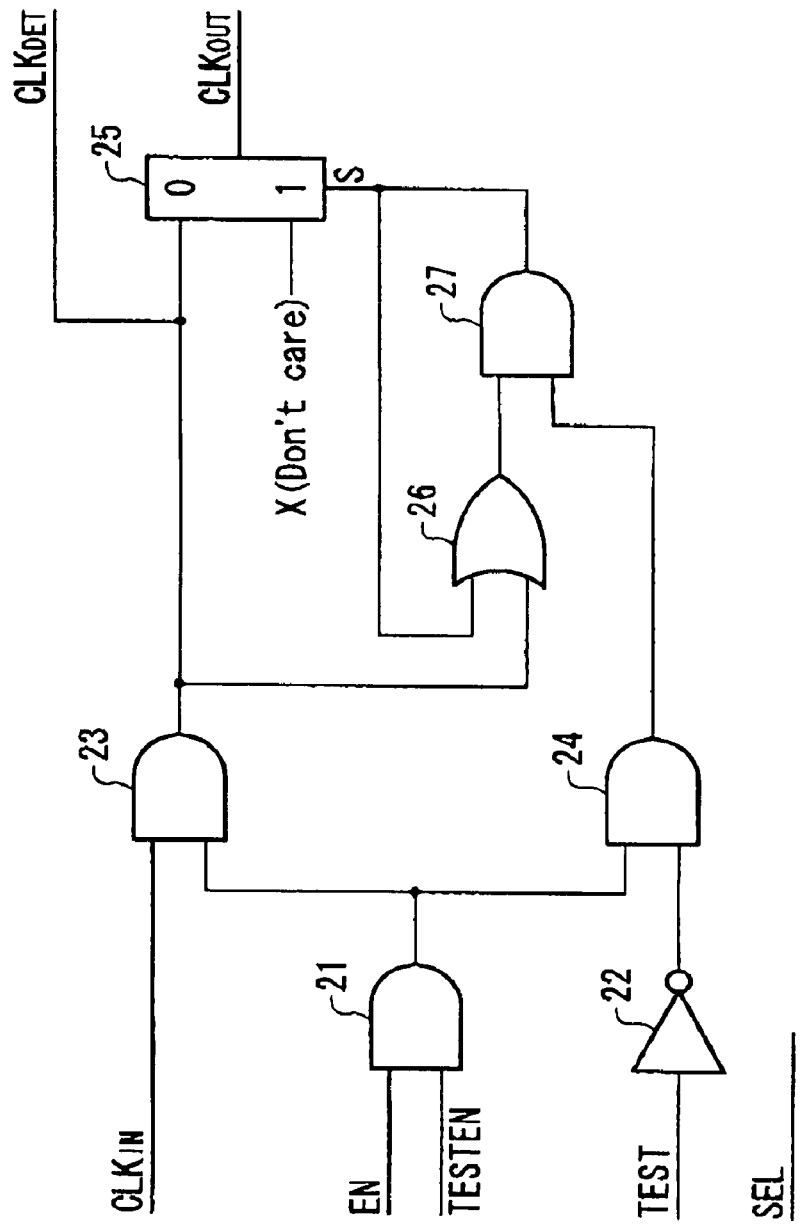
FIG. 7 is a schematic diagram showing a configuration of macrocell data relating to the fourth embodiment.

FIG. 7 is a schematic diagram showing one example of the logic circuit constituting the macrocell data according to the fourth embodiment. As shown in FIG. 7, the macrocell data according to the fourth embodiment is equipped with AND circuits 21, 23, 24, a NOT circuit 22, and a selector 25, just as the macrocell data according to the third embodiment. In addition, the macrocell data according to the fourth embodiment is further equipped with an OR circuit 26 and an AND circuit 27.

The OR circuit 26 is arranged to receive input signals, namely, an output signal from the AND circuit 23 and an output signal from the AND circuit 27. The AND circuit 27 is arranged to receive input signals, namely, an output signal from the AND circuit 24 and an output signal from the OR circuit 26. Furthermore in the fourth embodiment, the selector 25 is operable to perform a selection operation of input signals based on an output signal from the AND circuit 27.

Next, the relationship between the CLK$_{IN}$ signal inputted to the macrocell data and the CLK$_{OUT}$ signal outputted from the macrocell data in the fourth embodiment is explained with use of the logic circuit shown in FIG. 7. Note that the CLK$_{DET}$ signal outputted in the fourth embodiment has the same contents as its counterpart in the third embodiment, and so the explanation is omitted here. In addition, the CLK$_{OUT}$ signal in the logic verification (i.e. the case where the TEST signal is 1) also has the same contents as its counterpart in the third embodiment, and so the following explanation is constrained to the contents of the CLK$_{OUT}$ signal in the case where the TEST signal is 0.

When a pulse signal is inputted as a CLK$_{IN}$ signal, the value of the CLK$_{IN}$ signal will be 1 due to pulse rise. When the value of the CLK$_{IN}$ signal becomes 1, the value of the output signal from the AND circuit 23 will also be 1, and so at least one signal inputted to the OR circuit 26 will have a value of 1. Accordingly, the value of a signal outputted from the OR circuit 26 will be 1, and the value of an output signal from the AND circuit 24 will also be 1 when the value of the TEST signal is 0. As a consequence, the value of a signal outputted from the AND circuit 27 will be 1. Since such a signal is inputted to the selector 25, the contents of the CLK$_{OUT}$ signal will result in X (Don't care).

Also when the pulse falls, i.e. when the value of the CLK$_{IN}$ signal changes from 1 to 0, the macrocell data according to the fourth embodiment will continue outputting X (Don't care). That is, immediately before the pulse fall, the value of the signal outputted from the AND circuit 27 is 1 according to the above-described mechanism. In addition, the output from the AND circuit 27 is not only connected to the selector 25, but also to one input side of the OR circuit 26, as shown in FIG. 7. Consequently, the OR circuit 26 receives input of a signal outputted from the AND circuit 27, i.e. a signal whose value is 1. Accordingly, the value of a signal outputted from the OR circuit 26 will remain as 1 without change even if the other input side of the OR circuit 26 receives 0 due to the change of the value of the CLK$_{IN}$ signal to 0. As a result, the value of a signal inputted to the selector 25 will be 1, maintaining the contents of the CLK$_{OUT}$ signal as X (Don't care). In this way, when the value of the TEST signal is 0 in the logic circuit shown in FIG. 7, if a signal that repetitively changes between 1 and 0 (i.e. pulse signal) is inputted as the CLK$_{IN}$ signal, the contents of the CLK$_{OUT}$ signal to be outputted will always be X (Don't care).

On the other hand, when the value of the CLK$_{IN}$ signal always becomes 0, the contents of the CLK$_{OUT}$ signal will be always the value of the CLK$_{IN}$ signal itself. That is, by setting the default value of the output signal from the AND circuit 27 as 0, every signal inputted to the OR circuit 26 will be 0. This is because the signal outputted form the OR circuit 26 will also have the value of 0, and accordingly the signal outputted from the AND circuit 27 will have the value of 0. In summary, when the TEST signal takes the value of 0, the macrocell data according to the fourth embodiment does not equally set the contents of the CLK$_{OUT}$ signal being an output signal as X (Don't care), but instead outputs the value of the CLK$_{IN}$ signal as the value of the CLK$_{OUT}$ signal on condition that the CLK$_{IN}$ signal maintains the value of 0.

Next, advantages of the macrocell data according to the fourth embodiment are described. In the third embodiment, when the TEST signal takes the value of 0, the contents of the CLK$_{OUT}$ signal being an output signal from the macrocell data is equally set as X (Don't care), because the result of logic verification or the like will become uncertain if performing the same processing as in the case when the TEST signal takes the value of 1. However, actual uncertainty occurs from the time when CLK$_{IN}$ signal changes, and no problem will be caused in other cases attributable to the time delay. In view of this, the fourth embodiment is configured so that when the CLK$_{IN}$ signal maintains the value of 0, the value of the CLK$_{IN}$ signal is outputted as the value of the CLK$_{OUT}$ signal, even if the TEST signal takes the value of 0. This avoids inconvenience inherent in logic verification, and realizes macrocell data that faithfully reproduces the function of the actual variable delay circuit.

It should be noted that the macrocell data according to the fourth embodiment should not be construed as limited to the logic configuration shown in FIG. 7, just as in the third embodiment. That is, the macrocell data according to the fourth embodiment may have a logic specification corresponding to a logic circuit other than the logic circuit shown in FIG. 7, as long as defining a logic specification so as to output X (Don't care) as the CLK$_{OUT}$ signal, if the TEST signal is 0 (i.e. if the CLK$_{IN}$ signal functioning as the input signal under a condition that the variable delay assigning circuit is selected is a pulse signal), and as well as to output a signal equal to the CLK$_{IN}$ signal as the CLK$_{OUT}$ signal if the CLK$_{IN}$ signal is maintained as the value of 0.

Moreover, the third embodiment and the fourth embodiment have such a logic specification that when the value of the TEST signal is 1 (in the fourth embodiment this includes a case where the value of the TEST signal is 0 and the value of the CLK$_{IN}$ signal is maintained as 0), the value of the CLK$_{OUT}$ signal is equaled to the value of the CLK$_{IN}$ signal. However, it is not necessary to limit to such a configuration. Concretely, the value of the output signal may be realized by means of either a positive logic or a negative logic of an input signal. In view of this, it is also possible to set the the $CLK_{OUT}$ signal to have a value that is reverse to the $CLK_{IN}$ signal, in the third embodiment and the fourth embodiment.

Fifth Embodiment

Next, an electronic device according to the fifth embodiment is described. The electronic device according to the fifth embodiment is an integrated circuit equipped with a variable delay circuit having the function described in the first embodiment.

Figure 8:
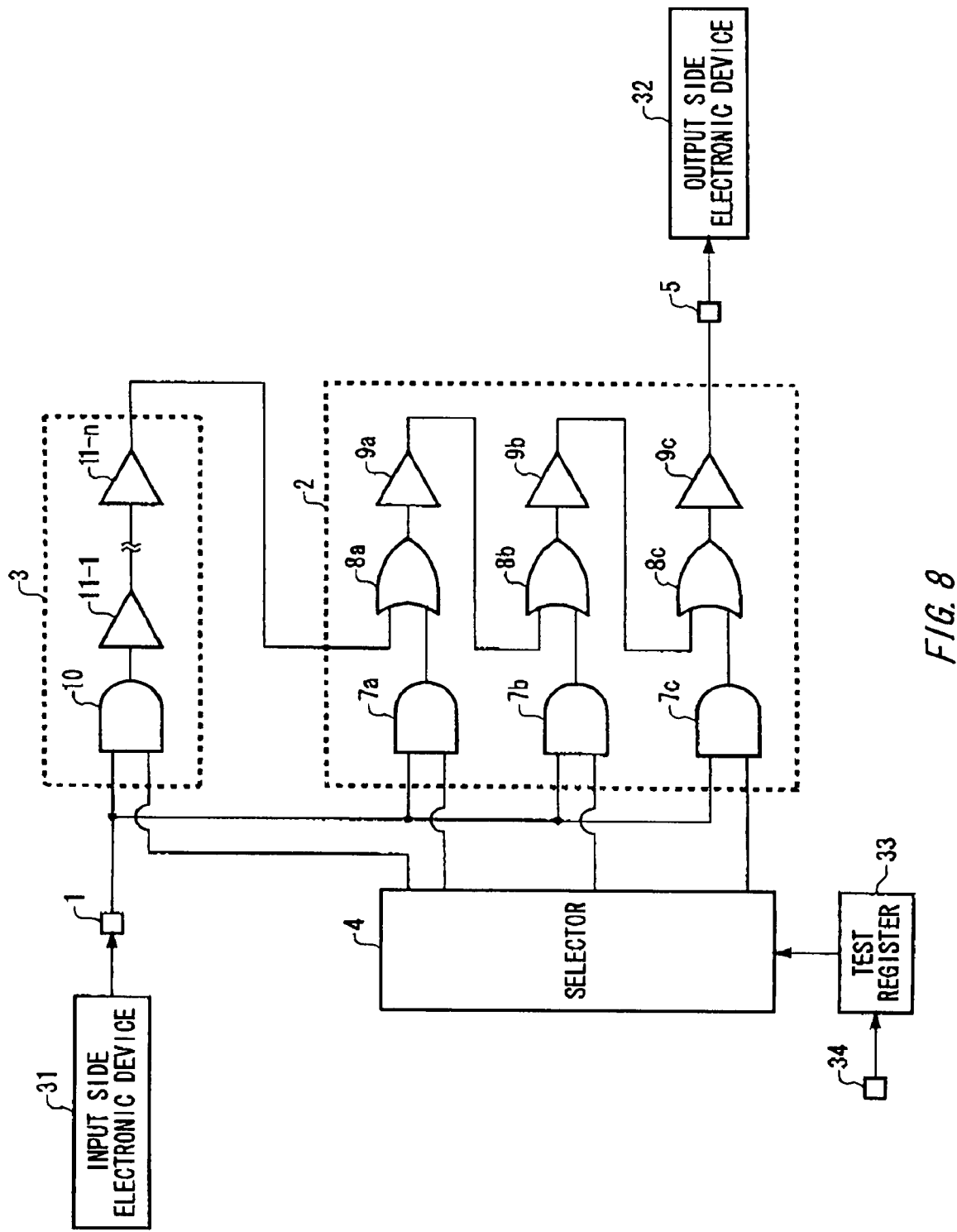
FIG. 8 is a diagram showing a configuration of an electronic device relating to the fifth embodiment.

FIG. 8 illustrates a configuration of the electronic device according to the present embodiment. The electronic device according to the present embodiment includes an input terminal 1, a variable delay assigning section 2, a verification delay assigning section 3, a selector 4, and an output terminal 5, which are included in the variable delay circuit shown in FIG. 1. The electronic device according to the present embodiment further includes an input side electronic circuit 31, an output side electronic circuit 32, a test register 33, and a test mode input terminal 34.

The input side electronic circuit 31 outputs an electric signal from a device included therein. The electric signal outputted from the input side electronic circuit 31 is inputted to the input terminal 1 as an input signal to the variable delay circuit. The output side electronic circuit 32 receives input of a signal outputted from the output terminal 5, at a device included therein. In other words, the output side electronic circuit 32 receives input of a signal having been delayed by the variable delay circuit.

An operation mode of the electronic device is set to the test register 33. Concretely, one of an actual operation mode for actually operating the electronic device and a test mode in which the electronic device is subjected to either low-speed logic verification or low-speed testing is set as the operation mode. The operation mode set to the test register 33 is changed according to a test mode signal inputted via the test mode input terminal 34 from outside.

The selector 4 selects one of the variable delay assigning section 2 and the verification delay assigning section 3, according to the mode set to the test register 33. Furthermore, the selector 4 further selects the time delay when selecting the variable delay assigning section 2.

Concretely, when the actual operation mode is set to the test register 33, the selector 4 selects the variable delay assigning section 2 operable to vary the time delay, and adjusts the time delay used by the variable delay assigning section 2 to an appropriate time that is in accordance with the characteristics of the electronic device. As an example, the selector 4 adjusts the time delay that enables the signal inputted to the output side electronic circuit 32 to be synchronized with the signal outputted from another electronic circuit. By allowing the selector 4 to select the variable delay assigning section 2 and the time delay used therein, the electronic device of the present embodiment is able to assign an appropriate delay to an electric signal outputted from the input side electronic circuit 31, and input the electric signal assigned the delay to the output side electronic circuit 32.

In addition, the selector 4 selects the verification delay assigning section 3 that assigns a fixed time delay, in case where a test mode has been set to the test register 33. The verification delay assigning section 3 is one example of a low-speed operation delay assigning section of the present invention. When the selector 4 selects the verification delay assigning section 3, the verification delay assigning section 3 supplies an input signal delayed by the amount of a predetermined fixed time delay, to the output side electronic circuit 32. Accordingly, when being subjected to low-speed logic verification or to a low-speed test, the electronic device can be tested at optimal timing, and such problems as judging a non-defective item as defective are prevented.

It should be noted that the input side electronic circuit 31 may be installed in the electronic device according to the present embodiment, or outside the electronic device. If the input side electronic circuit 31 is installed outside, an input signal is inputted from an outside input terminal of the input side electronic circuit 31 to the input terminal 1.

In addition, a test mode signal inputted from the test mode input terminal 34 is directly inputted to the verification delay assigning section 3, and when receiving the test mode input signal, the verification delay assigning section 3 may supply an input signal assigned a delay in the amount of a pre-set fixed time delay to the output side electronic device 32.

Furthermore, during the test mode, the electronic device according to the present embodiment may directly input a signal assigned a delay by the verification delay assigning section 3 to the output side electronic circuit 32 without via the variable delay assigning section 2, or may alternatively input an input signal to the verification delay assigning section 3 after passing the input signal through the variable delay assigning section 2 in advance.

In addition, when there is set a mode for simply lengthening the amount of time delay, the electronic device according to the present embodiment may delay an input signal by a fixed time delay amount by selecting the verification delay assigning section 3. In other words, the electronic device according to the present embodiment is a semiconductor device equipped with an electronic circuit capable of operating at a plurality of different operation speeds, the semiconductor device including: a delay circuit that gives time delay of different lengths to an input signal of the electronic circuit, in accordance with the operation speeds. As an example, the delay circuit may give time delay of relatively different lengths to a plurality of input signals, in accordance with the operation speeds. For example, the plurality of input signals may be a clock signal, a data signal, and a control signal such as a latch signal, an enable signal, or the like.

The macrocell data according to each of the stated embodiments may be a program executable by means of a computer, or program data that becomes a program executable by means of a computer by being compiled. As other embodiments, the macrocell data according to each of the stated embodiments may be an instruction or data for designating an operation mode and an operation method of other programs prepared in advance.

Moreover, it is apparent to any person skilled in the art to provide a recording medium storing therein a program for causing a computer to perform the operations mentioned in each of the above-described embodiments. In this case, an example of such a recording medium is a recording medium storing therein a program for causing a computer to conduct logic verification directed to an integrated circuit to which a delay circuit is implemented, the program including: a variable delay assigning circuit data code that causes a variable delay assigning circuit to be incorporated into the integrated circuit, the variable delay assigning circuit being for assigning a variable time delay to an input signal by being selected as the delay circuit in an actual operation of the integrated circuit, the variable time delay being varied within a predetermined range in accordance with a time delay inherent in an implementation level; a verification delay assigning circuit data code that causes the computer to emulate a verification delay assigning circuit being for assigning a predetermined fixed time delay to the input signal by being selected as the delay circuit in a logic verification operation of the integrated circuit; and a verification code that causes the computer to conduct logic verification directed to the integrated circuit, based on the verification delay assigning circuit emulated as the delay circuit.

What is claimed is:

1. An electronic device including an electronic circuit capable of operating at a plurality of different operation speeds, the electronic device comprising:

a delay circuit that applies time delays of different lengths to an input signal of the electronic circuit in accordance with the operation speeds, wherein the delay circuit comprises:

a variable delay assigning section that outputs, in an actual operation of the electronic device, an input signal to a second device within the electronic circuit by being delayed by a first time delay that is varied according to characteristics of the electronic device, the input signal having been inputted either from an outside input terminal of the electronic device or from a first device within the electronic circuit;

a low-speed operation delay assigning section that outputs, in low-speed operation of the electronic device, the input signal to the second device within the electronic circuit by being delayed by a second time delay having been pre-set, wherein the low-speed operation delay assigning section delays the input signal by the second time delay in the case of low-speed logic verification or a low-speed test of the electronic device; and a test register that sets a test mode in which the electronic device is subjected to the low-speed logic verification or the low-speed test, and wherein the low-speed operation delay assigning section outputs the input signal to the second device by being delayed by the second time delay, when the test mode has been set in the test register.

2. The electronic device as set forth in claim 1, wherein the delay circuit applies time delays of relatively different lengths to a plurality of input signals of the electronic circuit in accordance with the operation speeds.

3. The electronic device as set forth in claim 1, wherein the delay circuit further comprises a test mode input terminal that inputs a test mode signal for designating the low-speed logic verification or the low-speed test with respect to the electronic device, and wherein the low-speed operation delay assigning section outputs the input signal to the second device by being delayed by the second time delay, when the test mode signal has been inputted from the test mode input terminal.

4. An electronic device including an electronic circuit capable of operating at a plurality of different operation speeds, the electronic device comprising:

a delay circuit that applies time delays of different lengths to an input signal of the electronic circuit in accordance with the operation speeds, wherein the delay circuit comprises:

a variable delay assigning section that outputs, in an actual operation of the electronic device, an input signal to a second device within the electronic circuit by being delayed by a first time delay that is varied according to characteristics of the electronic device, the input signal having been inputted either from an outside input terminal of the electronic device or from a first device within the electronic circuit; and a low-speed operation delay assigning section that outputs, in low-speed operation of the electronic device, the input signal to the second device within the electronic circuit by being delayed by a second time delay having been pre-set, and wherein the second time delay delays the input signal by a predetermined fixed time delay.

5. The electronic device as set forth in claim 4, wherein the delay circuit applies time delays of relatively different lengths to a plurality of input signals of the electronic device, in accordance with the operation speeds.

6. The electronic device as set forth in claim 4, wherein the low-speed operation delay assigning section delays the input signal by the second time delay in the case of low-speed logic verification or a low-speed test of the electronic device.

7. The electronic device as set forth in claim 6, wherein the delay circuit further comprises a test mode input terminal that inputs a test mode signal for designating the low-speed logic verification or the low-speed test with respect to the electronic device, and wherein the low-speed operation delay assigning section outputs the input signal to the second device by being delayed by the second time delay when the test mode signal has been inputted from the test mode input terminal.

* * * * *